US006426714B1

(12) United States Patent
Ruha et al.

(10) Patent No.: US 6,426,714 B1
(45) Date of Patent: Jul. 30, 2002

(54) MULTI-LEVEL QUANTIZER WITH CURRENT MODE DEM SWITCH MATRICES AND SEPARATE DEM DECISION LOGIC FOR A MULTIBIT SIGMA DELTA MODULATOR

(75) Inventors: Antti Ruha; Tarmo Ruotsalainen; Jussi-Pekka Tervaluoto Tervaluoto, all of Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/892,145

(22) Filed: Jun. 26, 2001

(51) Int. Cl.[7] .................................................. H03K 3/00
(52) U.S. Cl. ...................... 341/143; 341/144; 341/155; 341/172; 341/118; 341/120
(58) Field of Search ................................ 341/143, 144, 341/142, 152, 155, 126, 172

(56) References Cited

U.S. PATENT DOCUMENTS

| 5,144,308 | A | | 9/1992 | Norsworthy |
| 5,406,283 | A | * | 4/1995 | Leung .................. 341/143 |
| 5,745,061 | A | | 4/1998 | Norsworthy et al. |
| 5,889,482 | A | | 3/1999 | Zarubinsky et al. |
| 5,990,815 | A | | 11/1999 | Linder et al. |
| 5,990,819 | A | | 11/1999 | Fujimori |
| 6,011,501 | A | | 1/2000 | Gong et al. |
| 6,087,969 | A | | 7/2000 | Stockstad et al. |
| 6,304,608 | B1 | * | 10/2001 | Chen et al. ............... 341/143 |
| 6,346,898 | B1 | * | 2/2002 | Melanson ................ 341/143 |
| 6,369,733 | B1 | * | 4/2002 | Tucker et al. ............ 341/143 |

FOREIGN PATENT DOCUMENTS

WO    WO 98/44626    10/1998

OTHER PUBLICATIONS

Multibit Σ–Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992. vol. 39 No. 1; Jan. 1992.

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise–Shaping Coder Topology for 15+ Bit Converters; Carley, L. Richard; IEEE Journal of Solid–State Circuits, vol. 24, No. 2; Apr. 1989.

* cited by examiner

Primary Examiner—Patrick Wamsley
Assistant Examiner—Lam T. Mai
(74) Attorney, Agent, or Firm—Harrington & Smith, LLP

(57) ABSTRACT

A multilevel quantizer is provided in combination with dynamic element matching (DEM) circuitry in a multibit sigma-delta modulator. The DEM circuitry is implemented in a divided manner as two major component parts: at least one current mode DEM switch matrix (SM), and an associated DEM decision logic block that implements the DEM control algorithm and that controls the SM. The DEM decision logic block is removed from the delay sensitive sigma-delta feedback loop, while the DEM SM remains within the feedback loop. Also described is a convenient and efficient technique to implement the DEM SM, using current steering logic within the multibit quantizer. In this case one or more DEM switching matrices may be provided within the quantizer for reordering the N–1 digital output bits of the N-level quantizer.

18 Claims, 13 Drawing Sheets

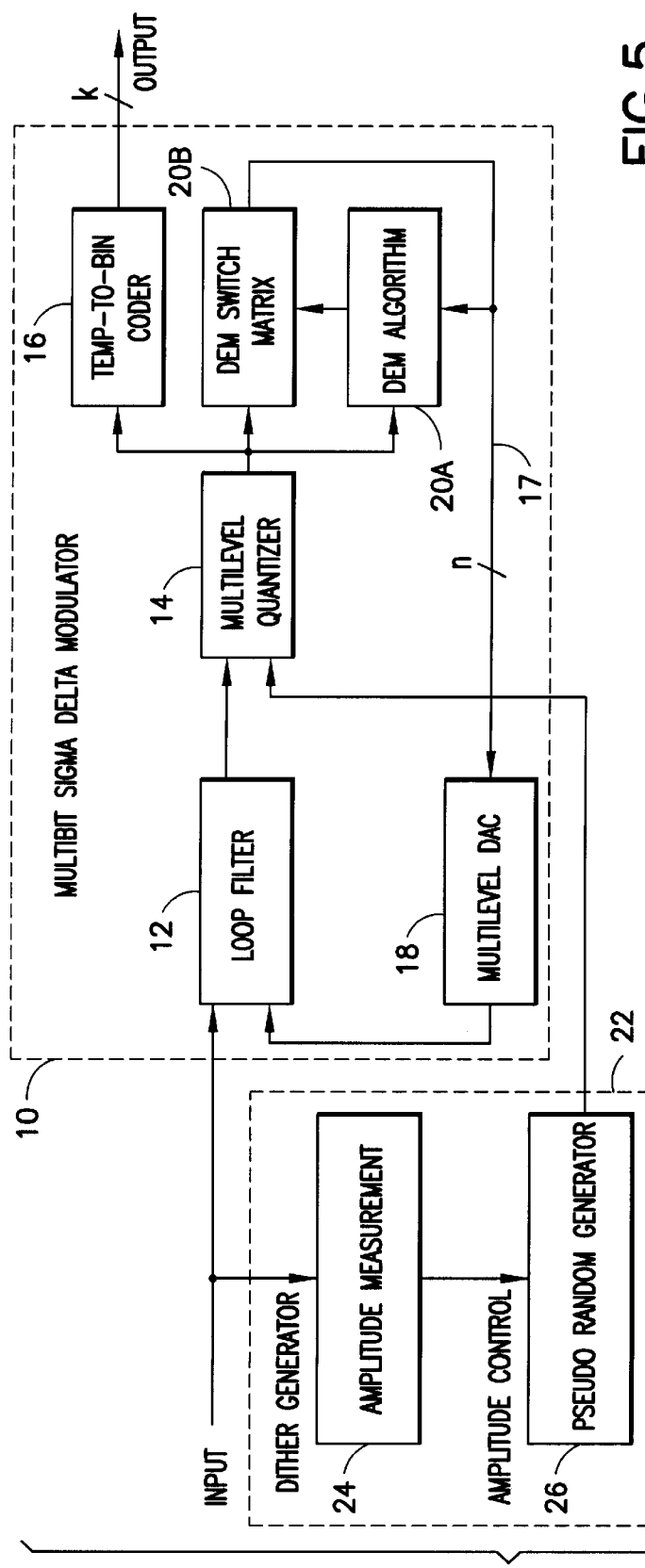
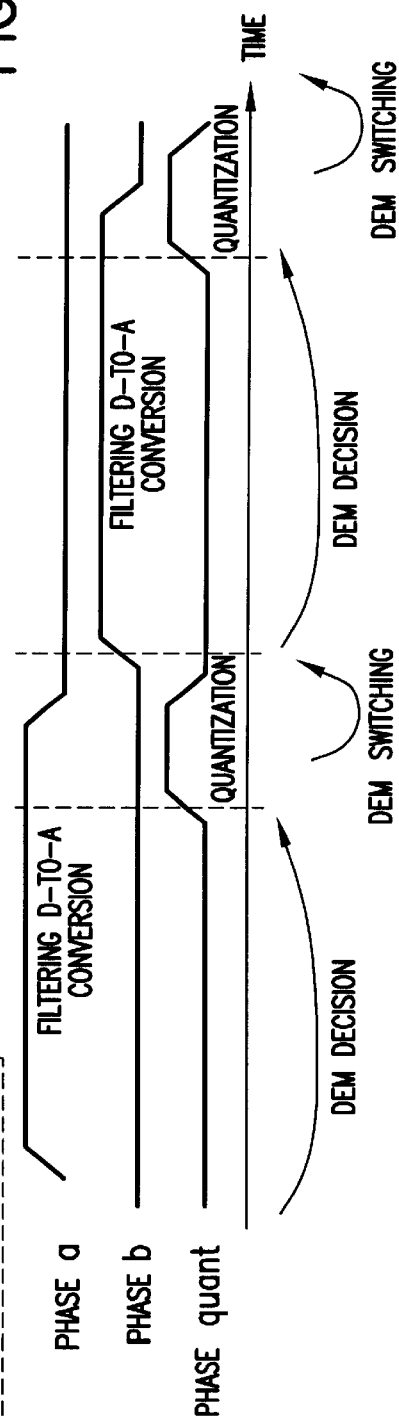
FIG.5

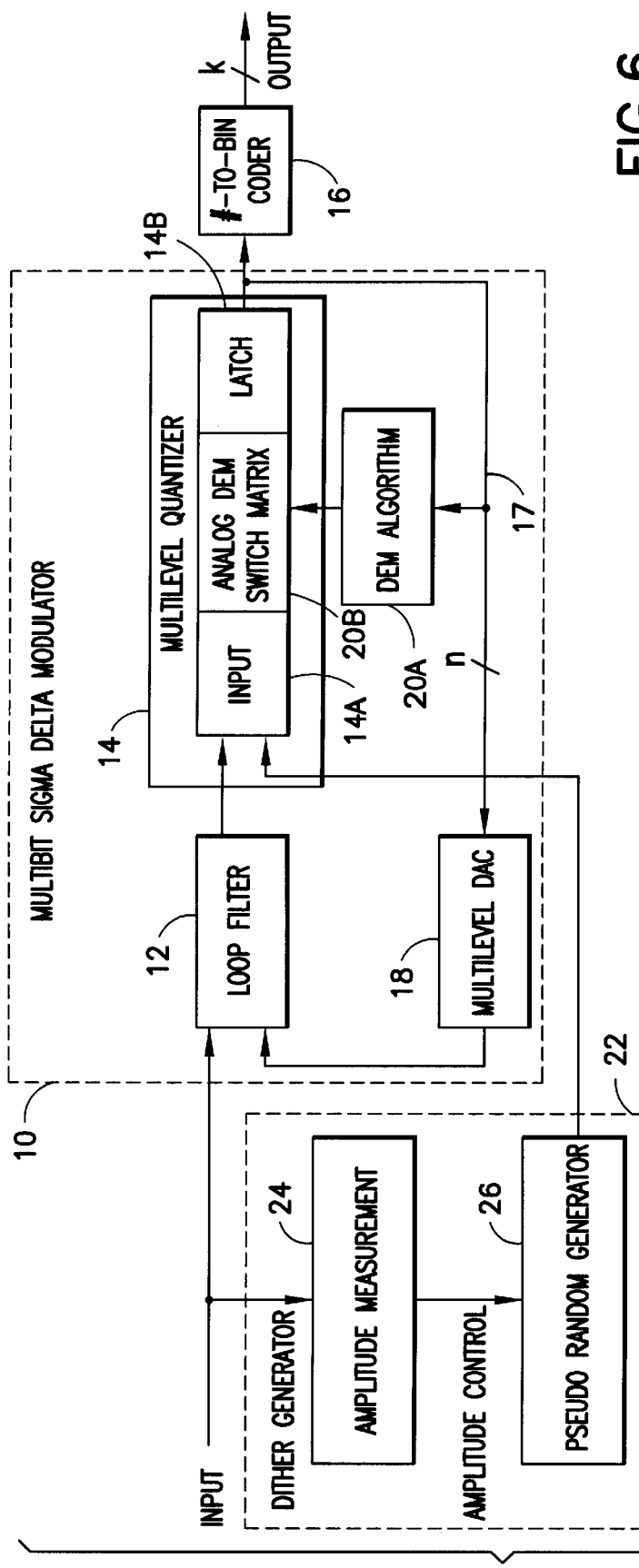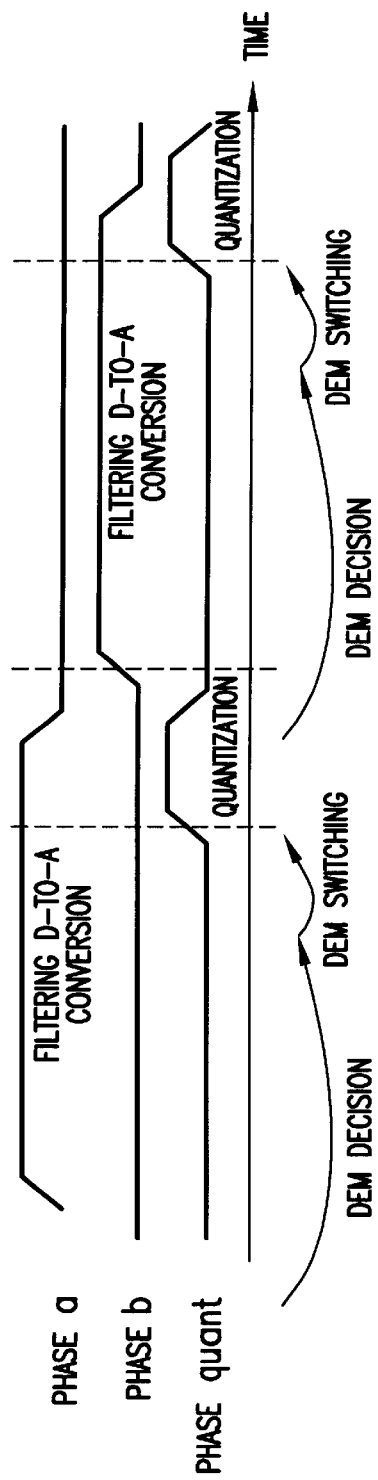
FIG.6

MULTI-LEVEL QUANTIZER WITH CURRENT MODE DEM SWITCH MATRICES AND SEPARATE DEM DECISION LOGIC FOR A MULTIBIT SIGMA DELTA MODULATOR

TECHNICAL FIELD

These teachings relate generally to analog-to-digital converter (ADC) circuitry and, more specifically, to sigma-delta (SD) modulators (SDMs), in particular multibit SDMs.

BACKGROUND

SD modulators used in ADCs and other applications are well known in the art. Reference may be had, by example, to S. R. Norsworthy et al., "Delta-Sigma Data Converters", IEEE Press, NY, 1997, and to J. G. Proakis et al., "Digital Signal Processing" Third Edition, Prentice-Hall, 1996. A typical embodiment of a SD modulator includes a loop filter followed by quantizer, and a digital-to-analog converter (DAC) in the feedback path.

Single-bit SD modulators are widely used in analog-to-digital converters (ADC) because they do not require accurate components, and can thus be readily implemented using modern CMOS processes. The single-bit DAC in the feedback loop is particularly easy to implement, as it is inherently linear. However, to achieve a high dynamic range the single-bit modulator requires a high oversampling ratio (OSR) or modulator order, which may result in a prohibitively large integrated circuit area and/or current consumption. The OSR and/or modulator order can be reduced by increasing the number of quantization levels, i.e. by using a multi-bit (MB) modulator, However, this approach requires a multibit DAC in the feedback loop and, since multibit DACs are not inherently linear, to achieve high accuracy (e.g., greater than 10 or 11 bits) either calibration or dynamic element matching (DEM) is often required.

Generally, multibit DACs are linearized with calibration techniques, or the effects caused by the nonlinearity of the multibit DAC are reduced with DEM circuitry implemented with conventional digital logic.

In the modern and emerging mobile communications protocols and systems, such as GSM/EDGE and WCDMA, stringent requirements (dynamic range and/or sampling frequency) are placed on the analog-to-digital conversion. In addition, multimode operation is often required, and the use of common hardware in the various modes is highly desirable, especially from the standpoint of making efficient use of integrated circuit area.

One of the strengths of the sigma-delta modulator technique is that there are several ways in which to configure the sigma-delta modulator to meet the required specifications. For example, the OSR, the modulator order and the number of quantization levels may all be varied depending on the application or mode of operation.

Furthermore, in order to fully exploit the benefits of modern digital signal processing during multimode operation, it is often desirable to use common radio frequency (RF) and analog baseband circuitry in all of the operational modes, and to then perform all protocol and system-specific functions in the digital domain. This places even higher requirements on the dynamic range and sampling frequency of the analog-to-digital converter. In addition, if the dynamic range and bandwidth of the analog-to-digital conversion can be made sufficiently large, it may be possible to eliminate some of the RF and analog baseband blocks, such as filters and variable gain amplifiers, thereby realizing further savings in cost, circuit area and power consumption.

As was noted above, to achieve a wide dynamic range single-bit modulators require a high OSR and/or modulator order, which may lead to a prohibitively large circuit area and/or current consumption. The OSR and the modulator order can be reduced by increasing the number of quantization levels, i.e. by using the multibit SD modulator. However, the use of multibit SD modulator introduces other problems, such as the nonlinearity of the feedback path SD modulator DAC caused by component mismatches.

SUMMARY

The foregoing and other problems are overcome by methods and apparatus in accordance with embodiments of these teachings.

A multilevel quantizer is provided in combination with dynamic element matching (DEM) circuitry in a multibit sigma-delta modulator. The DEM circuitry is implemented in an integrated circuit area and power efficient manner, and is also implemented so as to relax the strict timing constraints imposed on the operation of the DEM circuitry. The timing constraints arise from the fact that the sigma-delta modulator is a feedback system, and the DEM circuitry is a component part of the feedback loop.

In accordance with these teachings the DEM circuitry is divided into two major component parts: at least one DEM switch matrix (SM), preferably a current mode DEM switching matrix, and an associated DEM decision logic block that implements the DEM control algorithm and that controls the DEM SM. The DEM decision logic block is removed from the delay sensitive sigma-delta feedback loop, while the DEM SM remains within the feedback loop. In this manner the DEM decision logic block has more time to implement the DEM algorithm, which in turn gives more freedom and flexibility in the design of the DEM algorithm. One beneficial result is that, for example, a more complex DEM algorithm may be employed than would otherwise be possible.

Also described is a convenient and efficient technique to implement the DEM SM, using current steering logic within the multibit quantizer. In this case one or more DEM switching matrices may be provided within the quantizer for reordering the N−1 digital output bits of the N-level quantizer.

The undesirable effect caused by the nonlinearity of the multibit DAC, i.e., the generation of spurious and harmonic tones, is reduced by using the DEM SM to rearrange the bits according to a suitable algorithm so that the tones are converted to frequency-shaped noise.

The timing constraints limiting the choice of the DEM algorithm are overcome by placing the DEM decision logic block, which implements the DEM algorithm, outside of the delay-sensitive SDM feedback loop. In this manner the throughput may still be one control word per clock phase, but more freedom is provided in the selection of the DEM algorithm, i.e. one may select a relatively simple DEM algorithm (e.g., random, cyclic, data weighted averaging (DWA), etc.) or a more complicated DEM algorithm (e.g., one based on sorting). The DEM algorithm may be programmably changed during operation to match the operating and signal conditions, as well as the mode of operation in a multimode communication device.

The required circuit area, power consumption and speed of the DEM SM are improved as well, as a compound quantizer/SM structure is simple and convenient to implement, and has the potential to reduce the area, power consumption and delay in the feedback loop, as compared to using a separate quantizer and SM. The preferred current steering logic used in the DEM SM is dense, compact and fast, and if implemented with minimum size transistors, the additional capacitive load, and therefore also the increase in the current consumption, is insignificant.

A method is also disclosed for operating a quantizer of a sigma-delta modulator. The method includes sampling and converting a quantizer input signal to a sampled current signal; adding a dither current signal to the sampled current signal to generate a dithered sampled current signal; coupling the dithered sampled current signal to an input terminal of individual ones of N−1 comparator stages; dividing the dithered sampled current signal equally amongst the N−1 comparator stages; operating individual ones of the N−1 comparator stages to compare a divided portion of the dithered sampled current signal to an associated one of N−1 reference current signals; and latching an output of each of the N−1 comparator stages with one of N−1 latches. The method further operates at least one dynamic element matching (DEM) switching matrix to reorder a multibit digital signal appearing at N−1 digital output terminals of a quantizer circuit under control of a DEM algorithm logic block.

In one embodiment the step of operating at least one DEM switching matrix includes reordering the N−1 reference current signals at inputs to the N−1 comparators, while in another embodiment the step of operating the at least one DEM switching matrix includes reordering N−1 comparator output signals prior to latching the N−1 comparator output signals. Both embodiments may be used simultaneously by the quantizer.

The step of adding the dither current signal includes a step of generating the dither signal to have pseudorandom fluctuations in amplitude, and a magnitude that varies inversely to the magnitude of the input signal.

BRIEF DESCRIPTION OF THE DRAWINGS

The above set forth and other features of these teachings are made more apparent in the ensuing Detailed Description of the Preferred Embodiments when read in conjunction with the attached Drawings, wherein:

FIG. 5 illustrates the structure of a multibit sigma-delta modulator with separated DEM decision logic and DEM SM in accordance with an aspect of these teachings;

FIG. 6 shows the structure of a first embodiment of a multibit sigma-delta modulator with the DEM SM included within the quantizer;

DETAILED DESCRIPTION OF THE PREFERRED EMBODIMENTS

Figure 1:
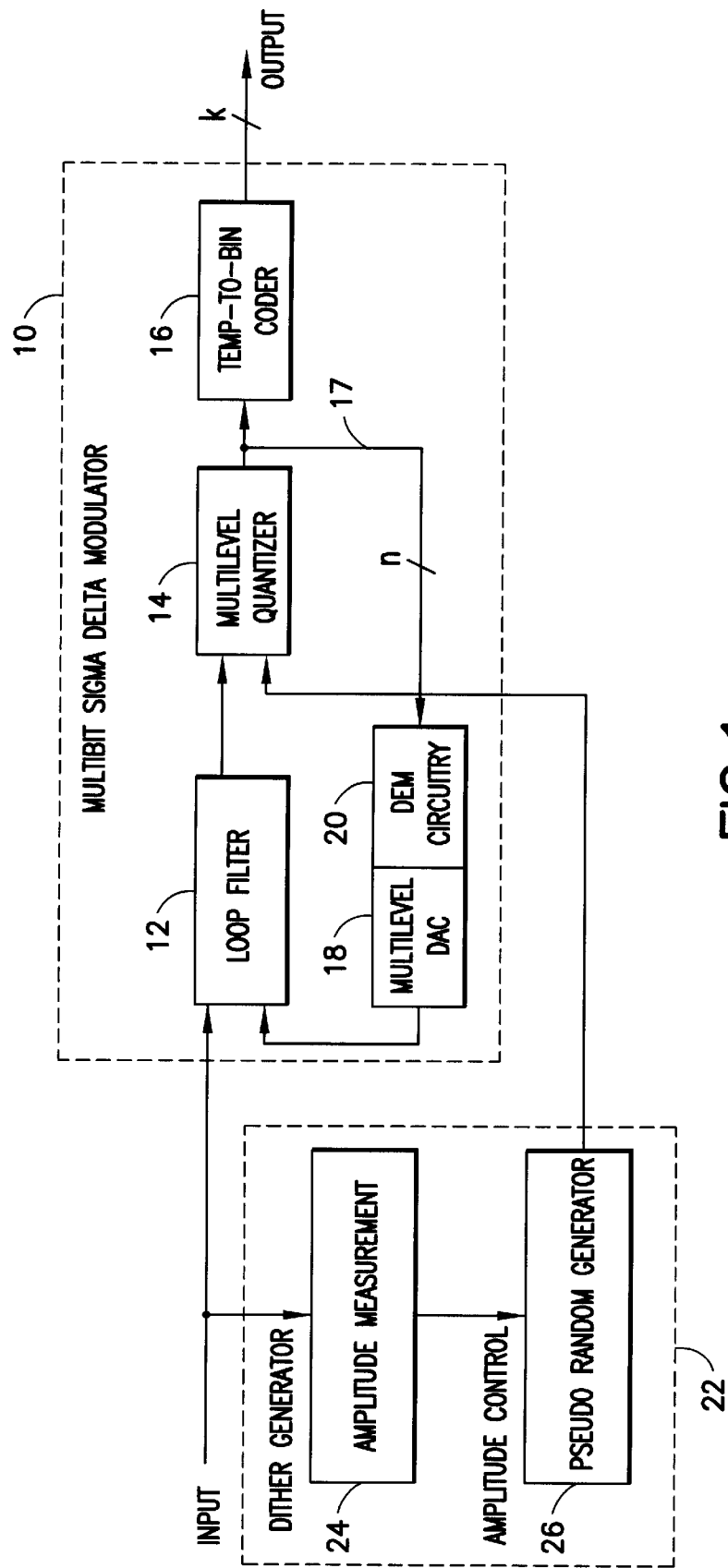
FIG. 1 illustrates the general structure of a multibit sigma-delta modulator, wherein the DEM circuitry is shown as part of the multibit DAC in a feedback path.

By way of introduction, the general structure of a multibit sigma-delta modulator 10 is shown in FIG. 1. The core of the multibit switched capacitor (SC) sigmadelta modulator 10 is composed of a loop filter 12, a quantizer 14, a coder 16 and a feedback path 17 containing a multibit DAC 18 and associated DEM circuitry 20. The loop filter 12 processes the analog input signal as well as the feedback signal from the DAC 18, and the output signal of the loop filter 12 is quantized with the multibit quantizer 14. The output of the quantizer 14 is coded (e.g., from a temperature code to a 2's complement code), and this multibit (k-bit) coded word is the output of the SD modulator 10. The output of the quantizer 14 is also fed to the DEM circuitry 20, the output of which controls the multibit DAC 18 in the feedback path. The effects resulting from the nonlinearity of the multibit DAC 18 due to element mismatches, in particular the spurious and harmonic tones, are reduced by using a DEM switch matrix (SM) to shuffle or rearrange the input bits to the DAC 18 according to a suitable algorithm. In this manner the undesirable tones are converted to frequency shaped noise.

In addition, a dither generator 22 can be employed to generate a dither signal that may be added to the input of the quantizer 14 to maintain the quantizer 14 in an active state with low level inputs. The use of the dither signal ideally avoids the generation of the unwanted tones (extraneous signals) in the SDM 10. The dither generator 22 can include an amplitude measurement block that feeds a pseudorandom dither signal generator.

Figure 2:
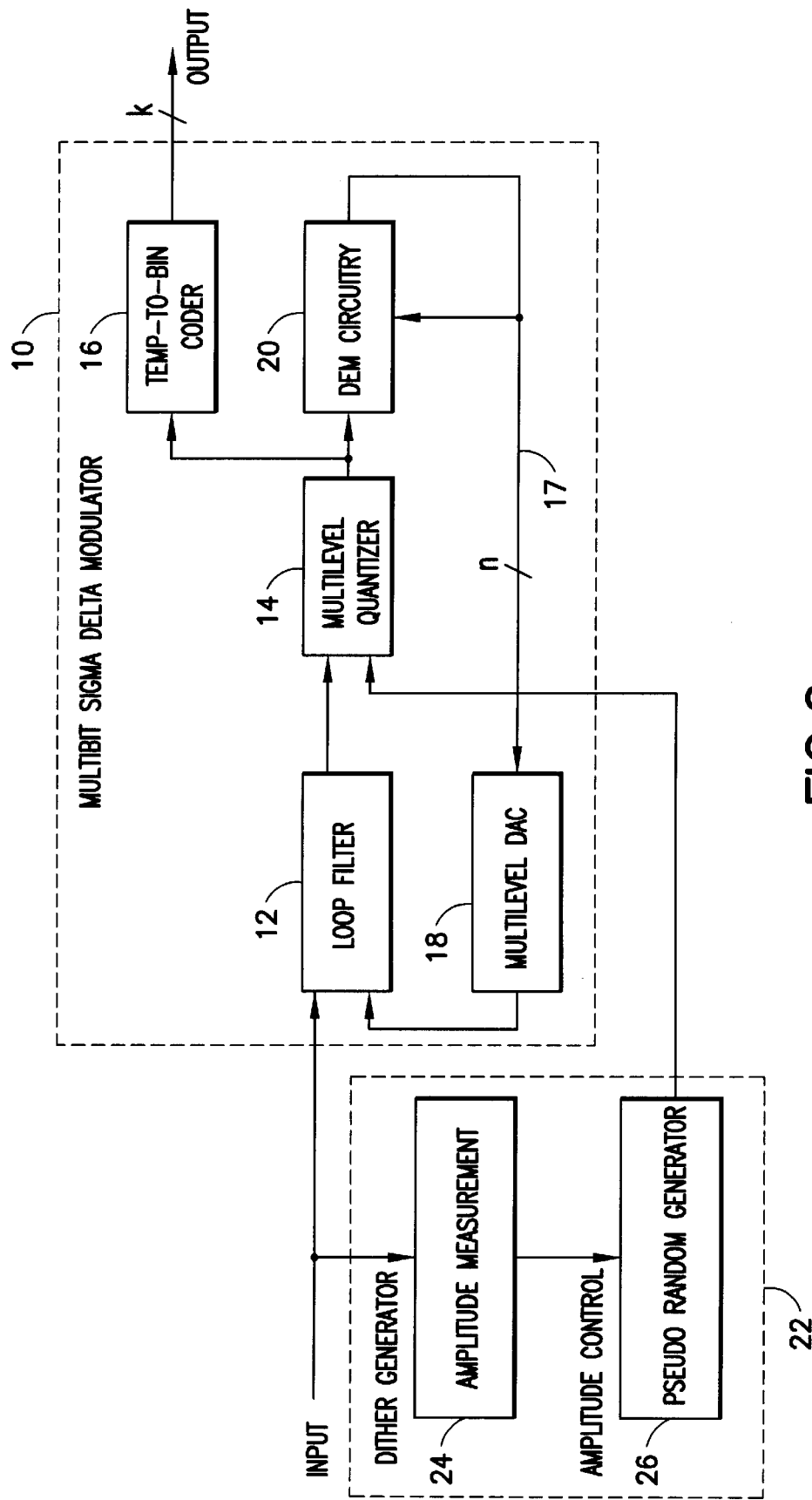
FIG. 2 shows a multibit sigma-delta modulator with the DEM circuitry separated from the multibit DAC.
Figure 3:
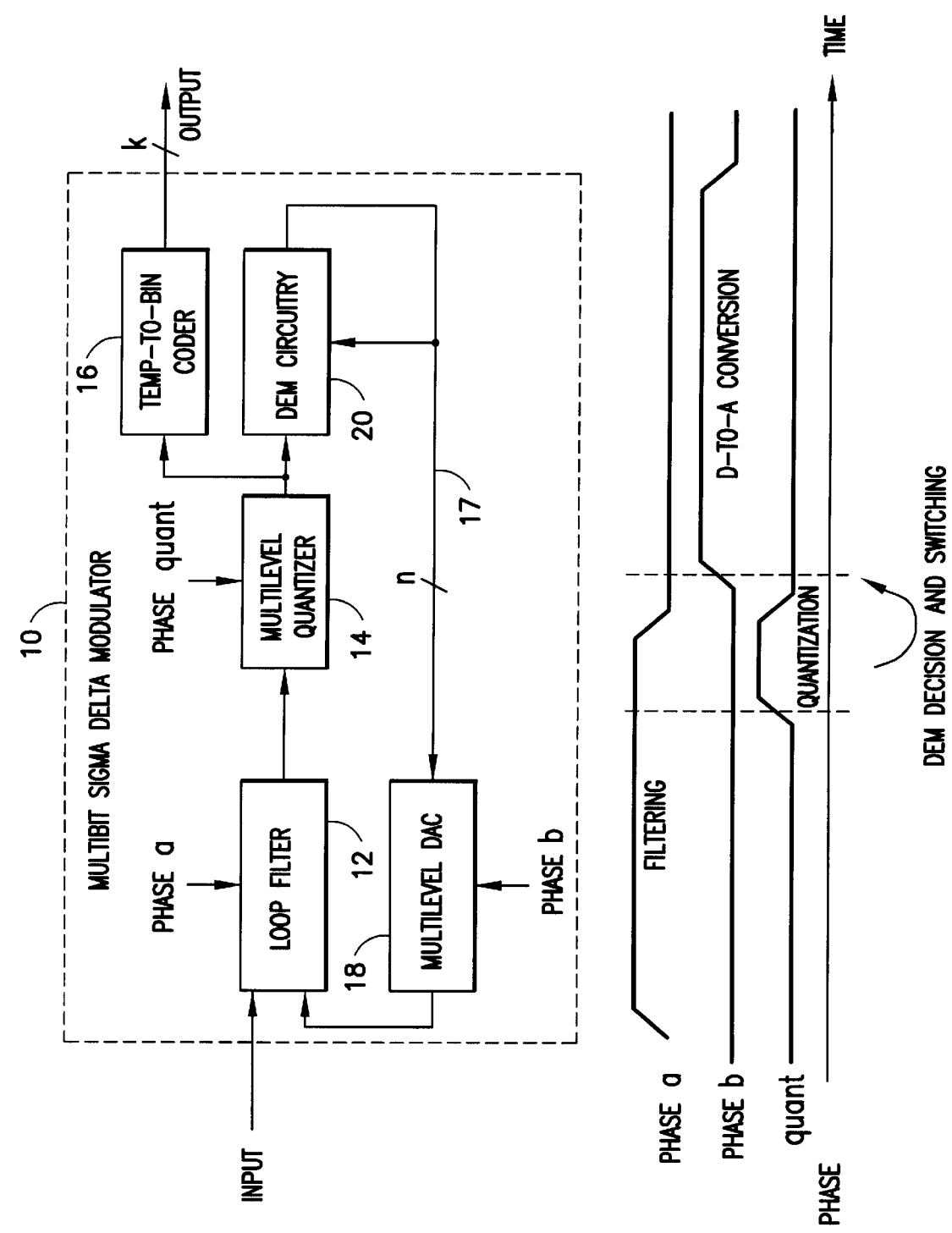
FIG. 3 shows the timing of the DEM circuitry with normal sampling.

FIG. 2 shows an embodiment of a multibit sigma-delta modulator 10 with the DEM circuitry 20 separated from the multibit DAC 18, while FIG. 3 shows the timing of the DEM circuitry 20 during normal sampling. In this case one clock cycle includes a first (filtering) phase (phase A) that is applied to the loop filter 12, a second (digital-to-analog conversion) phase B that is applied to the DAC 18. A sub-phase of phase A (quant) is applied to the quantizer 14, and controls the quantization of the filtered signal. Note that the DEM decision and switching is required to take place in the short period of time between the quantization and the next digital-to-analog conversion. Especially with high sampling rates this short period of time limits the complexity of the DEM algorithm executed by the DEM block 20.

Figure 4:
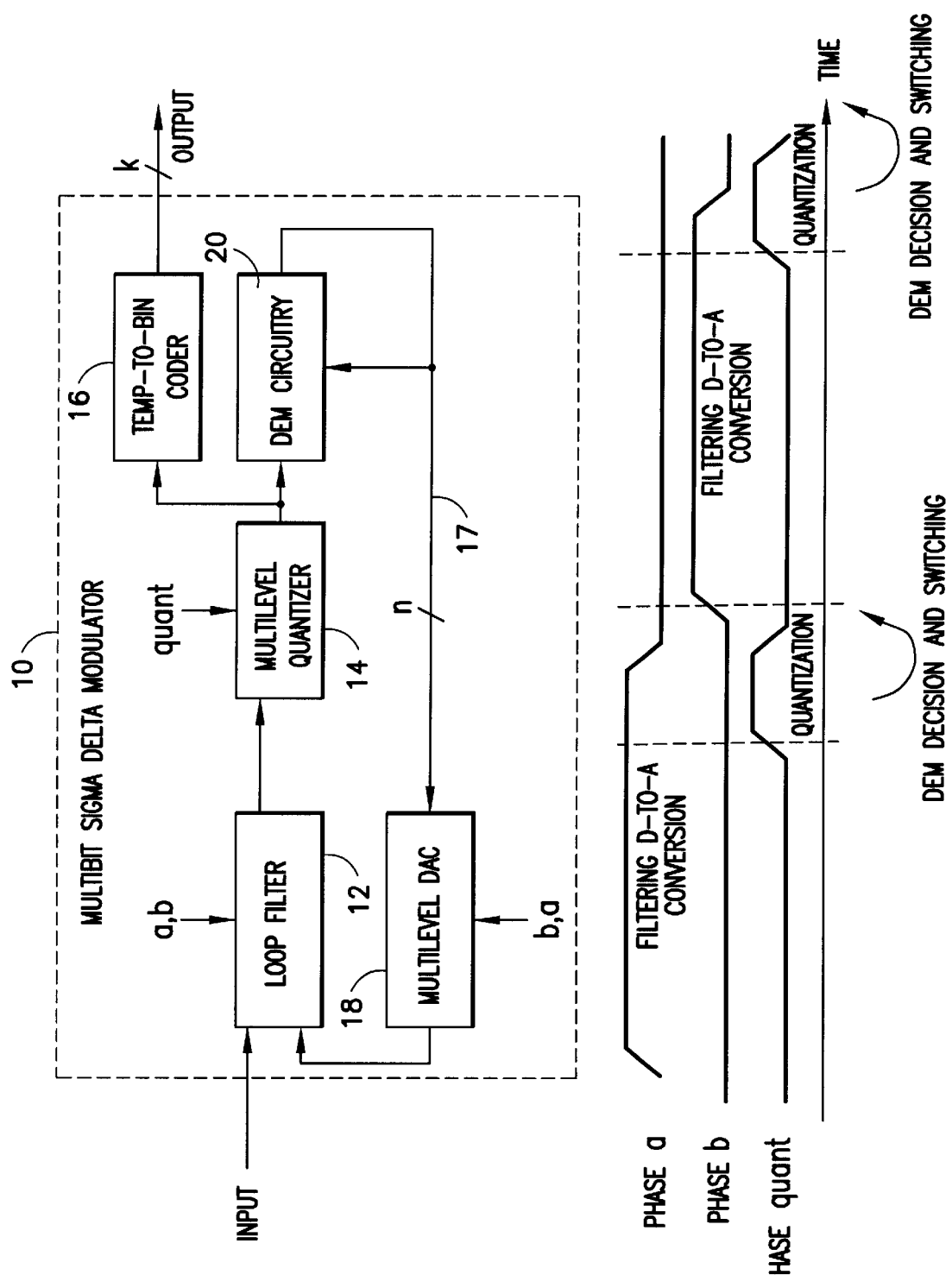
FIG. 4 shows the timing of the DEM circuitry with double sampling, where the same timing constraints apply as in the case of normal sampling.

FIG. 4 shows the timing of the DEM circuitry with double sampling. The same timing constraints apply as in the case of normal sampling. Note in this example that both clock phases A and B are applied to the loop filter 12, and the opposite phases B and A are applied to the DAC 18. During the quant sub-phase the DEM circuitry 20 is still required to process the bits output from the quantizer 14, and set the DEM switches accordingly.

FIG. 5 illustrates the structure of the multibit sigma-delta modulator 10 with the DEM decision logic block (DEM algorithm 20A) separated from the DEM SM 20B in accordance with an aspect of these teachings. The DEM decision logic block 20A reads the output of the quantizer 14 in one phase and generates the DEM SM control signals for the next phase, and therefore has additional time to resolve the output bits of the quantizer 14 and make the DEM SM switch control signal decision. Note that the DEM switching operation still occurs during the quant sub-phase, and that the throughput is still required to be one switch control operation per phase. The additional delay of one phase is taken into account in the design of the DEM algorithm to ensure stability and/or proper operation.

FIG. 6 shows the structure of a first embodiment of the multibit sigma-delta modulator with the DEM SM 20B located within the quantizer 14. In this case the analog DEM SM 20B is located between the quantizer input stage 14A, such as a plurality of current comparators, and a quantizer output stage 14B, typically a plurality of corresponding latches. In this embodiment the DEM switching is performed in the "analog" domain to reduce time and circuit area. Note in the timing diagram that the DEM switching operation takes place prior to the start of the quant sub-phase, and that the DEM decision operation performed by the DEM algorithm block 20A may be initiated during the quant sub-phase.

Figure 7:
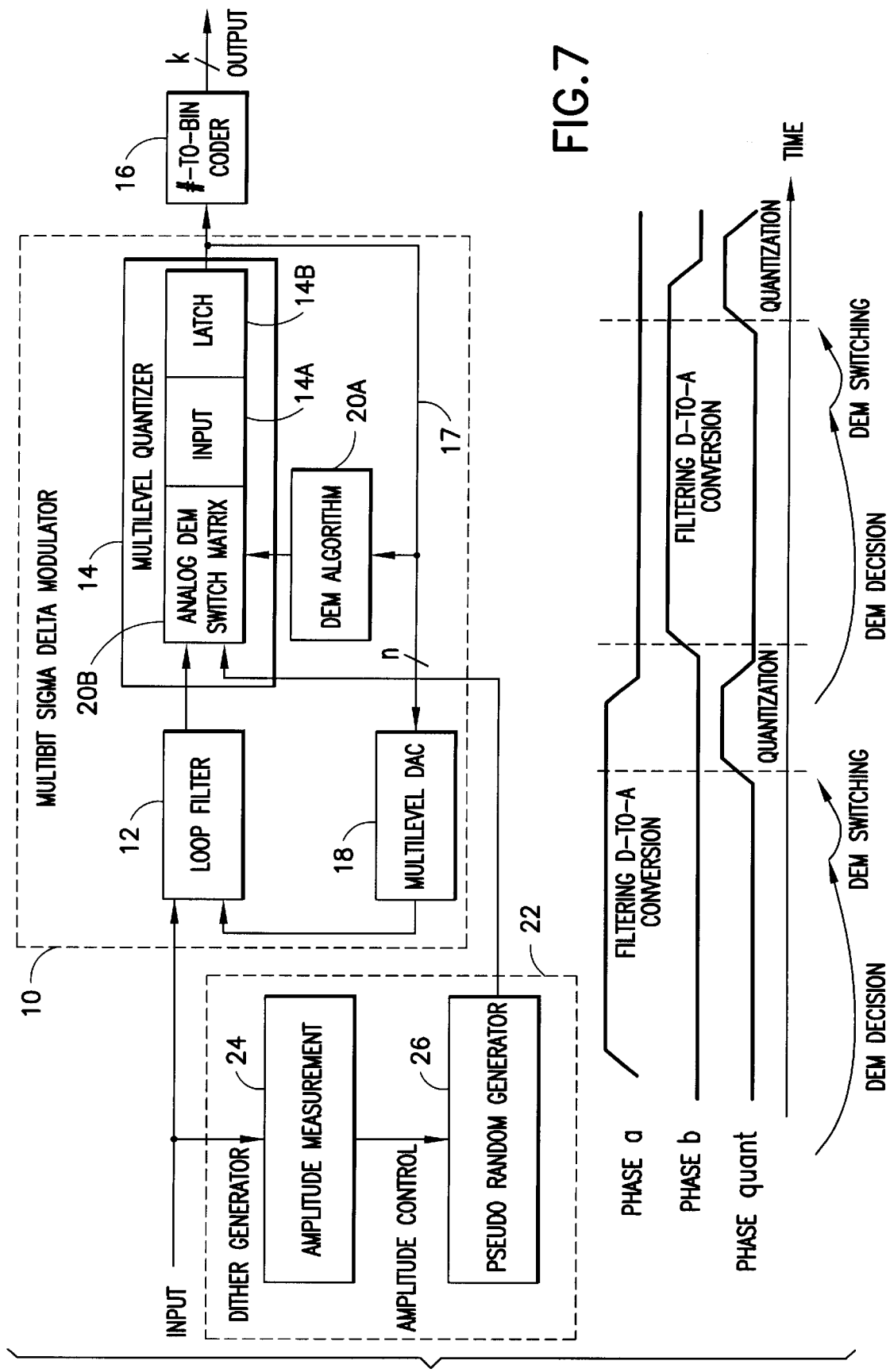
FIG. 7 shows the structure of a second embodiment of a multibit sigma-delta modulator with the DEM SM included within the quantizer.

FIG. 7 shows the structure of a second embodiment of the multibit sigma-delta modulator 10 with the DEM SM located within the quantizer 14. In this embodiment the analog DEM SM 20B is located before the input stage 14A of the multibit quantizer 14. Note that the DEM switching is done in the analog domain to reduce time and circuit area, and note as well that the timing diagram shows that the operation of the second embodiment of FIG. 7 can be identical to the operation of the first embodiment of FIG. 6.

Figures 8, 8A:
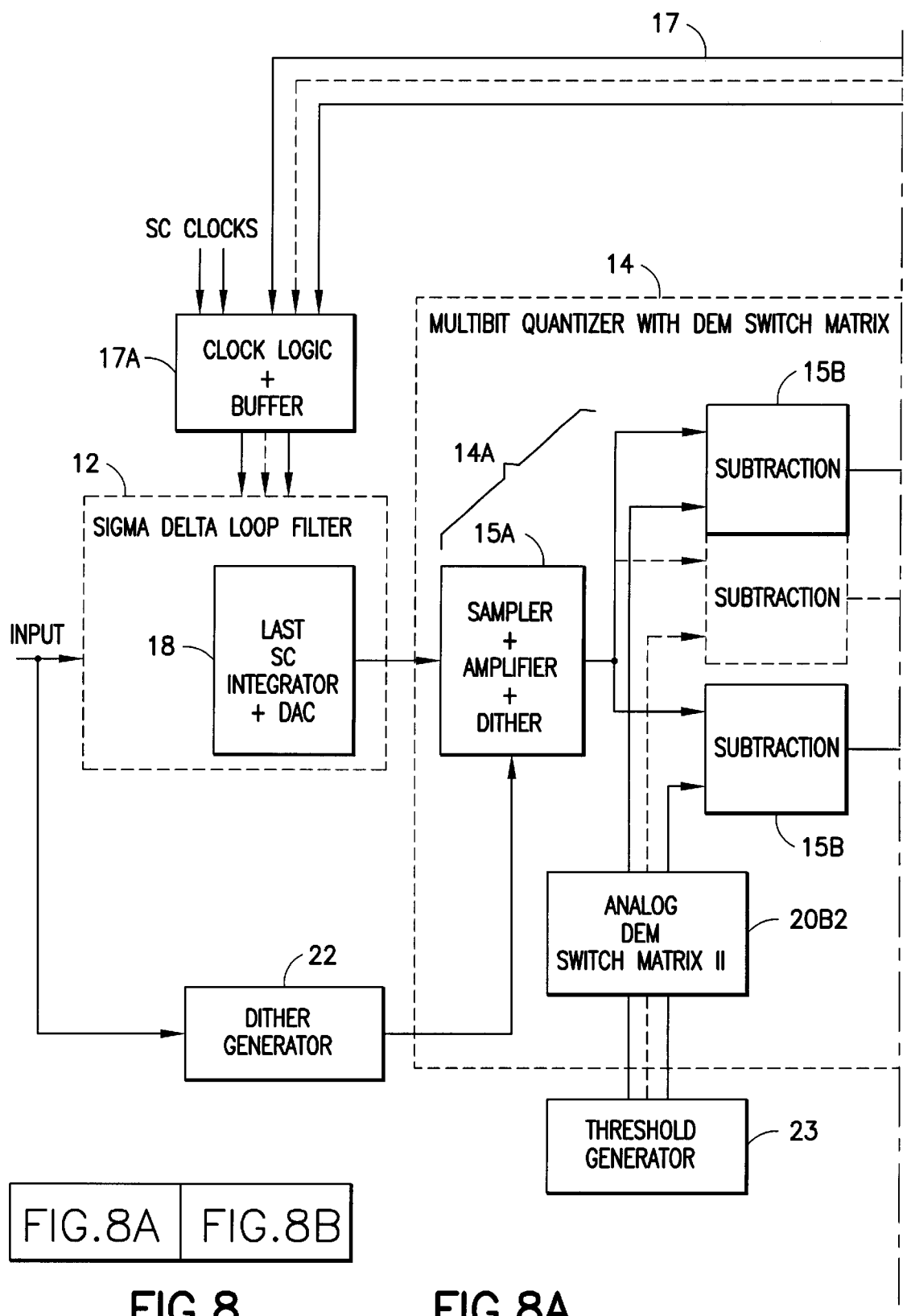
FIG. 8 shows the general structure of a multibit quantizer containing two DEM switch matrices.
Figure 8B:
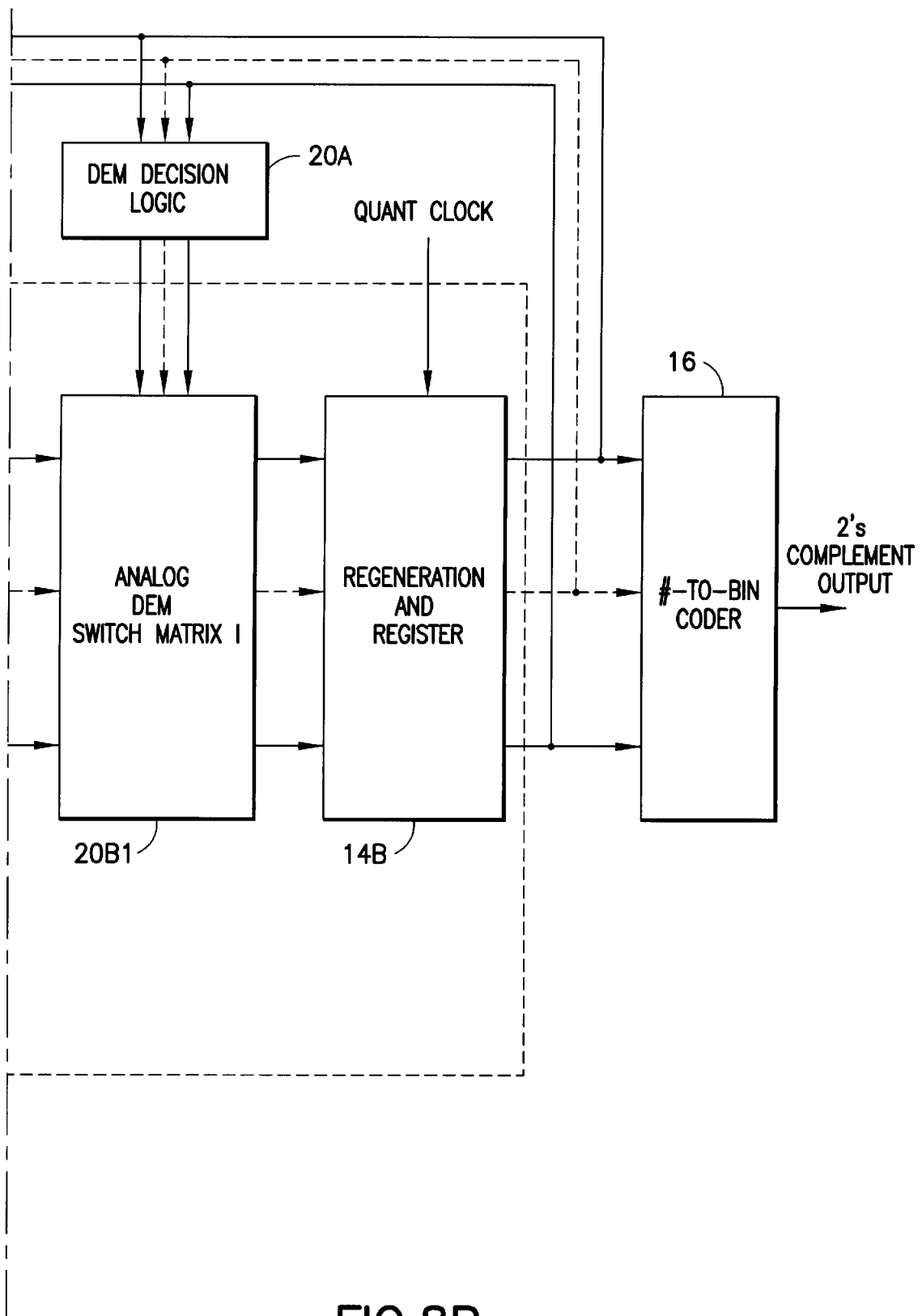

FIG. 8. shows the general structure of a multibit SDM 10 having the quantizer 14 containing two DEM switch matrices 20B1 and 20B2, corresponding to the embodiments of FIGS. 6 and 7, in addition to the dither generator 22 and multibit thresholding provided by a threshold generator 23. In this embodiment it may be advantageous from a timing and capacitive loading perspective to split the complex DEM algorithm into two parts, with one common DEM algorithm block 20A and the two switch matrices (SMs) 20B1 and 20B2. One DEM SM 20B2 is placed between the threshold generator 23 and the input stages 14A of the multibit quantizer 14. This has the effect of rearranging the quantizer input stages which, in this case, include a signal sampler, amplifier and dither current addition block 15A and a plurality of subtraction blocks 15B. The other DEM SM 20B1 is placed between the input stages 14A and the latch stages 14B, and has the effect of rearranging the quantizer output signals. The SMs 20B1 and 20B2 may have the same structure and topology, or they may have different structures and topologies for more efficiently implementing different types of bit rearrangement schemes. In addition, the SMs 20B1 and 20B2 may have different operating frequencies. For example, one SM may operate during each clock phase, and the other SM only occasionally, depending on the specifics of the operation of the DEM algorithm block 20A.

Figures 9, 9A:
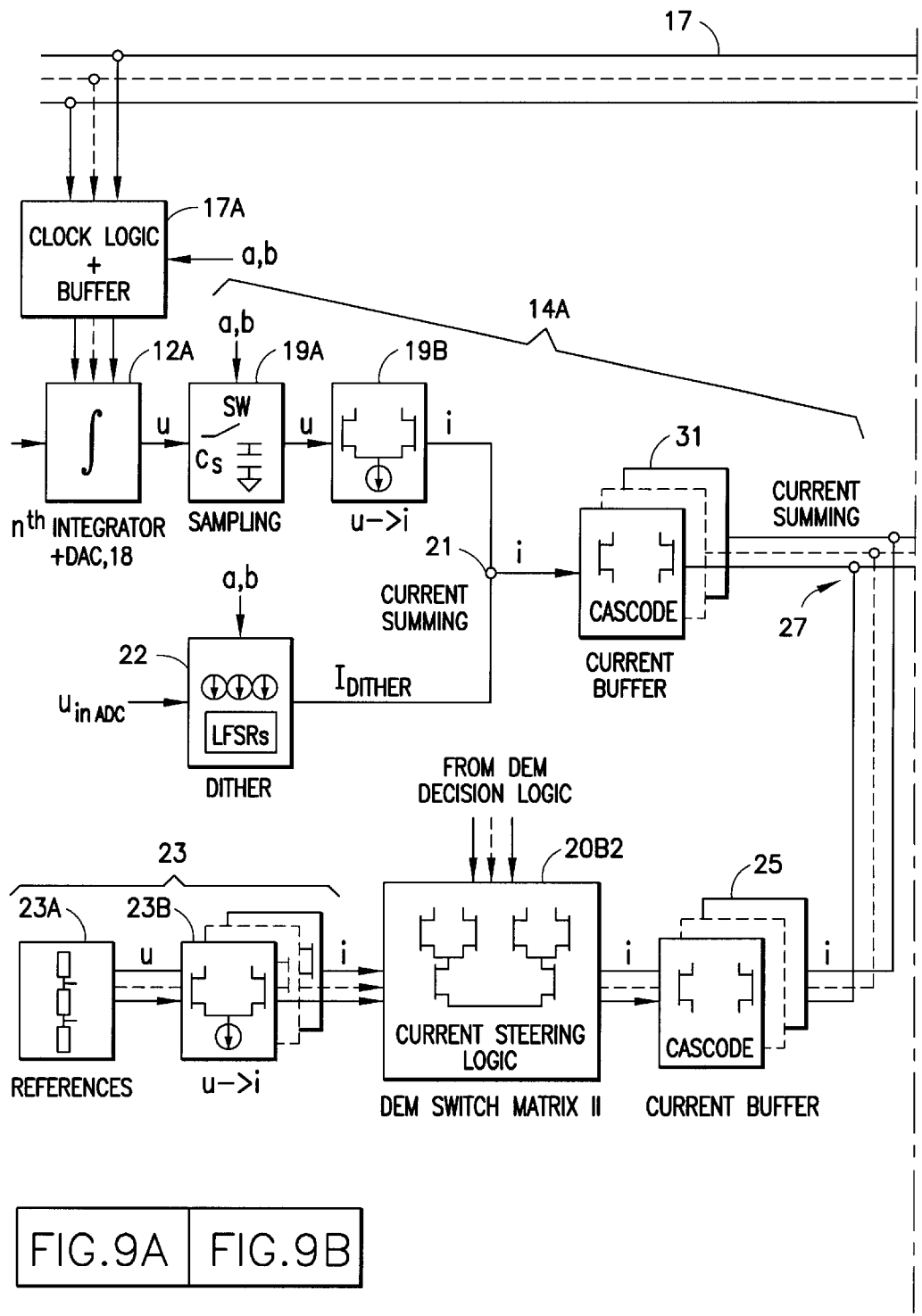
FIG. 9 illustrates an exemplary block diagram level implementation of the multibit quantizer with the two DEM switch matrices.
Figure 9B:
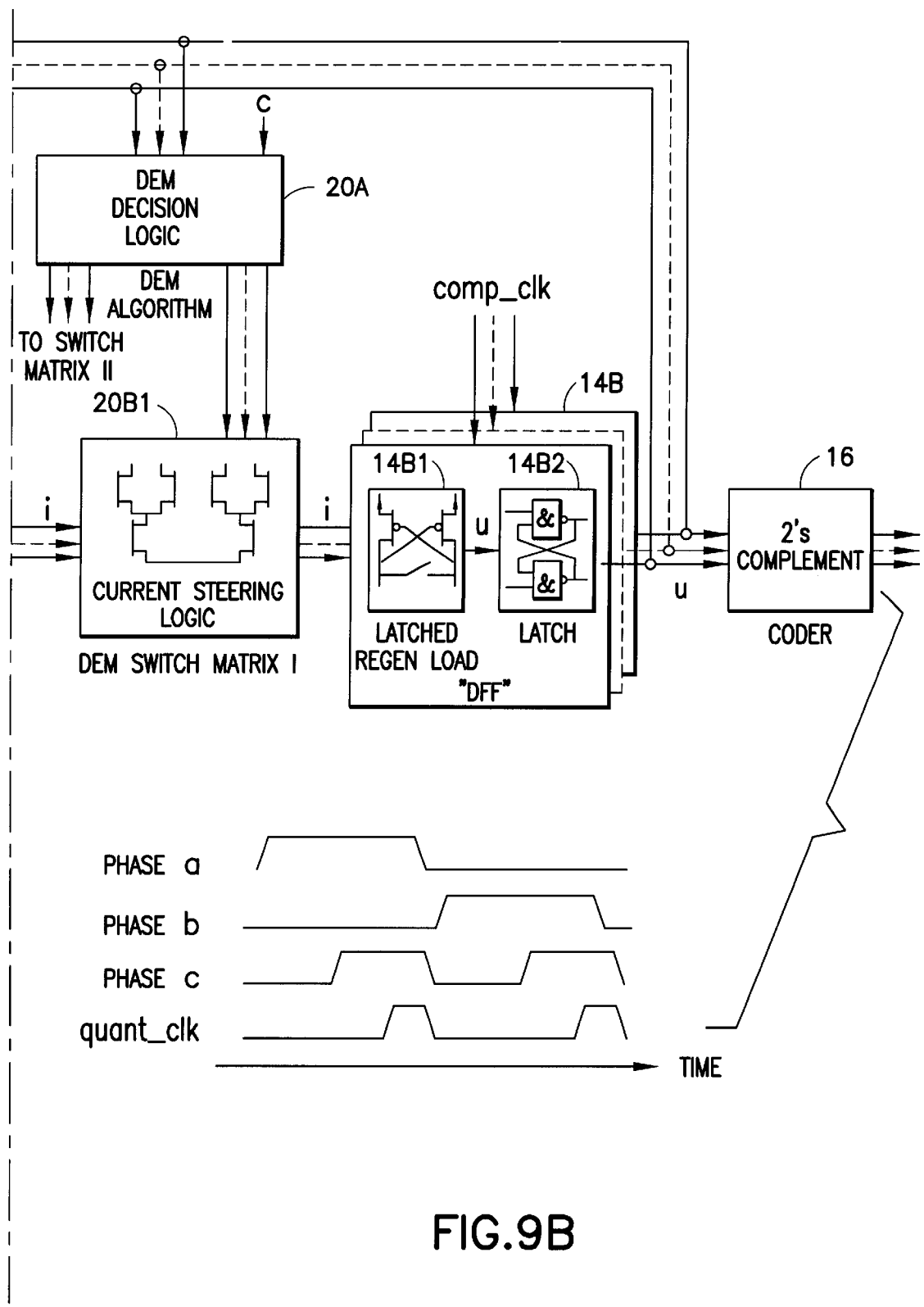

FIG. 9 is a more detailed block diagram of the multibit quantizer 14 with the two DEM switch matrices 20B1 and 20B2, as in FIG. 8. The operation of the quantizer 14 is as follows. The input signal for the quantizer 14, typically the output of the last integrator 12A of the loop filter 12, is applied to a sampling stage 19A where it is sampled onto a small capacitor (Cs) using a switch (SW). This technique avoids the injection of kickback noise from the quantizer 14 into the loop filter 12. The outputs of the latches 14B2 are fed to the clock logic and buffers 17A of the loop filter 12, via the feedback path 17. The digital-to-analog conversion is performed in the SC integrators 12A, under the control of the clock logic 17A. A differential pair amplifier 19B converts the sampled input voltage to a current (i), and this current is applied to a summing junction 21 where it is combined with the dither current from the dither generator 22.

Further in this regard, the input signal to the SDM 10 is also applied to the dither signal generator block 22 that includes the amplitude measurement block 24 that outputs an amplitude control signal to the pseudorandom dither signal generation block 26. The output of the pseudorandom dither signal generation block 26 is the dither signal, preferably the dither current (Idither), that is applied as a second input to the quantizer 14. The effect is to add pseudorandom noise, i.e., the dither signal, at the input of the quantizer 14. The amplitude of the pseudorandom noise (Idither) is controlled in such a manner as to be inversely proportional to the amplitude of the input signal. That is, the amplitude of the dither signal is smallest when the amplitude of the input signal is largest and vice versa. The use of the dither signal is preferred as it reduces the generation of unwanted tones in the output signal of the SDM 10 when the input signal amplitude is small, and thereby also increases the dynamic range of the SDM 10. As a non-limiting example, the pseudorandom dither signal generation block 26 may contain at least one linear feedback shift register (LFSR) operated in accordance with the output of the amplitude measurement block 24 for controlling the on and off states of a plurality of transistors forming a current steering DAC, and hence the amplitude (and polarity) of the dither current signal.

The sum current from summing node 21 is fed to the sources of N−1 (in N-level quantization) common gate input transistors (cascode current buffers 31) of the quantizer 14. The common gate transistors isolate the input stage from the dynamic latches 14B1 of the output stage 14B, and thus also reduce the kickback noise to the loop filter 12.

The threshold generator 23 includes, in one embodiment, a resistor string 23A (made of resistors or transistors) that is used to create evenly distributed reference voltages between positive and negative reference voltages. Differential pair amplifiers 23B are used to tap the appropriate threshold voltages and convert these voltages to reference currents. In another embodiment the circuits 23A and 23B may be replaced with a transconductor that feeds a plurality of weighted current mirrors for generating the desired reference current signals directly.

The second DEM SM 20B2, implemented as analog current steering logic, directs the reference currents according to the control signals generated by the DEM decision logic 20A to the sources of common gate input transistors of a second cascode current buffer 25. These common gate transistors function to isolate the resistive string 23A from the dynamic latches 14B1 of the second stage 14B of the quantizer 14, and thus reduce the introduction of kickback noise into the threshold generator 23.

The currents from the input stages that are sensing the output of the loop filter 12, and the currents from the input stages sensing the thresholds generated by the resistor string 23A, are summed at summing junction 27 and then fed to the first DEM SM 20B1.

The DEM SM 20B1, preferably also implemented as analog current steering logic, directs the sum currents according to the control signals generated by the DEM decision logic 20A to one of the latched loads of the output stage 14B. The latched loads comprise regenerative latched loads (dynamic latches 14B1 and static latches 14B2). The outputs of the latches 14B2 are fed to the clock logic and buffers 17A of the loop filter 12, via the feedback path 17. The digital-to-analog conversion is performed in the SC integrators 12A, under the control of the clock logic 17A.

The outputs of the latches 14B2 are also fed to the DEM decision logic block 20A, which generates the control signal for the DEM switch matrices 20B1 and 20B2 according to the selected DEM algorithm. Suitable DEM algorithm include, but are not limited to, random data averaging (RDA) and various cyclic algorithms including data weighted averaging (DWA) and a rotation-based DEM algorithm such as clocked averaging (CLA). More complex DEM algorithms may also be employed, such as a DEM algorithm based on sorting. In the cyclic DEM algorithms, such as rotation based CLA and DWA, the mismatch error of the DAC unit elements is converted into wide-band noise. The selected DEM algorithm may be changed during operation to accommodate changes in signal conditions, as well as the mode of operation in a multimode type of device.

General reference with regard to RDA can be made to a publication: L. Richard Carley, A Noise-Shaping Coder Topology for 15+Bit Converters, IEEE Journal of Solid-State Circuits, Vol. 24. No. Apr. 2, 1989. General reference with regard to DWA may be had to a publication: Rex T. Baird, Terry S. Fiez, Linearity Enhancement of Multibit $\Sigma\Delta$ A/D and D/A Converters Using Data Weighted Averaging, IEEE Transactions on Circuits and Systems—II: Analog and Digital Signal Processing, Vol. 42, No. Dec. 12, 1995, and with regard to CLA reference can be made to Y. Sakina, Multibit $\Sigma$-$\Delta$ Analog to Digital Converters with Nonlinearity Correction Using Dynamic Barrel Shifting, M.A.Sc thesis, ERL, Univ. California at Berkeley, 1990.

The output of the static latches 14B is also fed to the coder 16 which outputs, for example, a 2's complement digital representation of the quantization result. Other multibit digital output formats may also be used.

Figures 10, 10A:
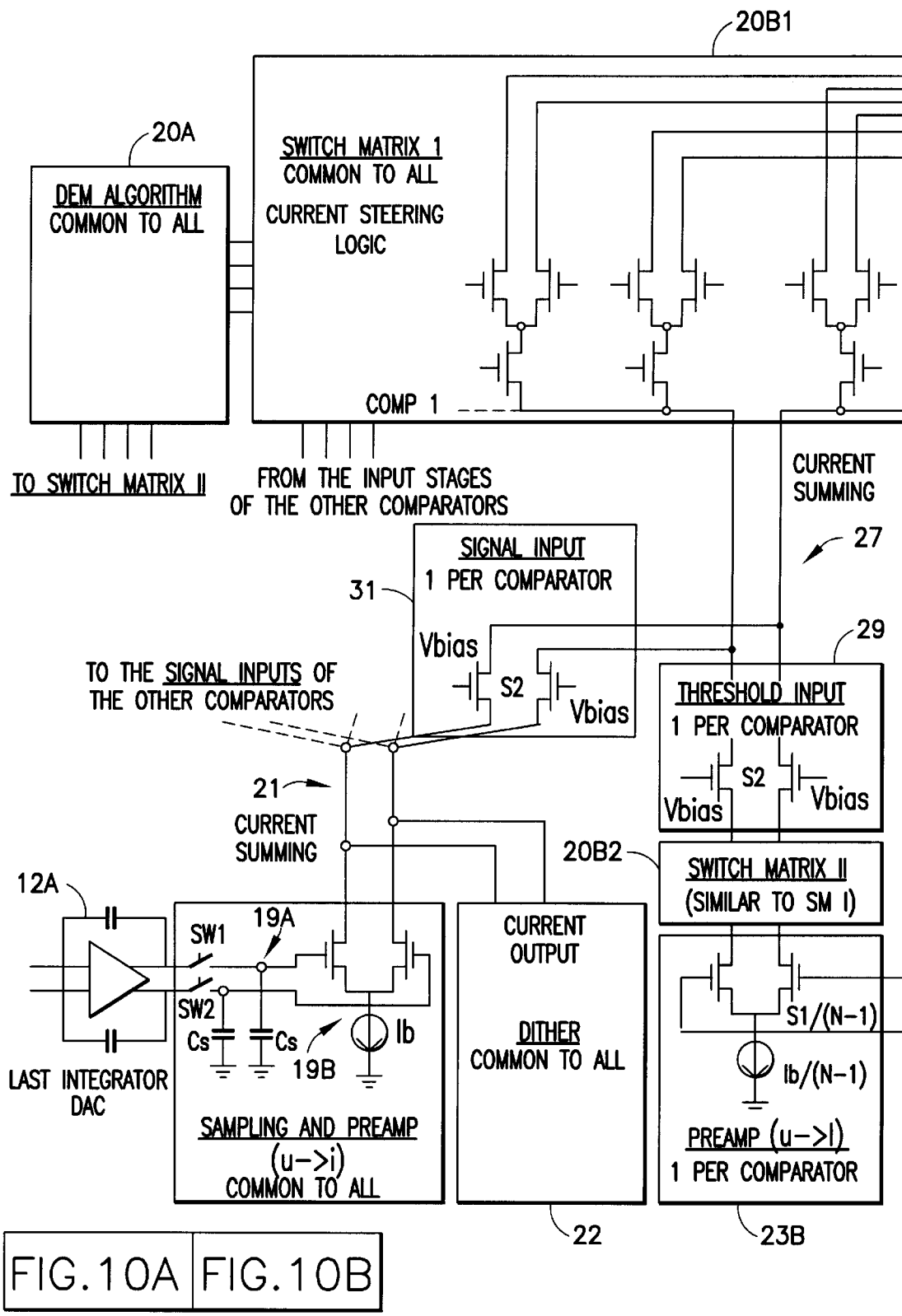
FIG. 10 depicts the two DEM switch matrix embodiment of FIG. 9 in greater detail.
Figure 10B:
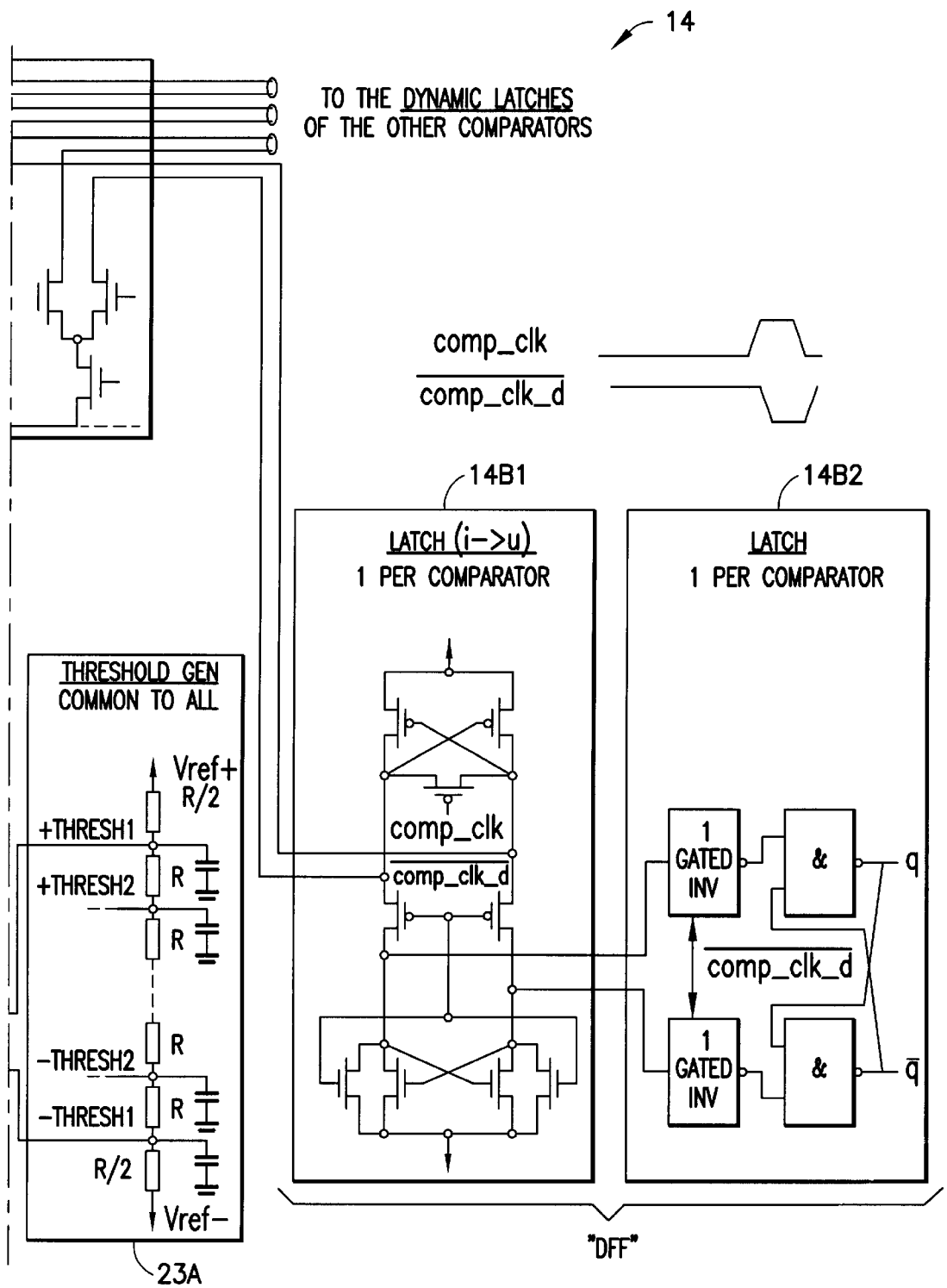

FIG. 10 is a more detailed block diagram of the quantizer 14 of FIG. 9. FIG. 10 illustrates the compound nature of the quantizer/SM structure, which can be seen to be relatively simple and convenient to implement, and which has the potential to reduce the area, power consumption and delay in the feedback loop 17, as compared to using a separate quantizer and SM. The illustrated construction of the SM 20B1 can be seen to use current steering logic that is dense, compact and fast, and if implemented with minimum size transistors, the additional capacitive load, and therefore also the increase in the current consumption, is small. The function of the SM 20B1 is to selectively route the output of the current comparator to the inputs of one of the dynamic latches 14B1, selected by the DEM algorithm block 20A, thereby reordering the output bits. The SM 20B2 can be constructed in a similar manner, and performs a further reordering at the inputs to the current comparators. In the preferred embodiment the combined signal and dither current at the summing junction 21 is split or divided evenly between the N−1 current comparators, via the cascode current buffers 31.

The preamplifier stage 19B includes a differential transistor pair that converts the sampled input voltage signal to a current signal. Each of the N−1 comparators include the input stage 31 constructed to include common gate configured transistors that operate to suppress the feedback of noise from the N−1 latches to the output of the loop filter 12. As all of the common gate transistors of the input stages 31 may have identical dimensions, and as they all have the same source and gate voltages, the currents through these transistors are equal. Therefore the current is equally divided between the N−1 comparator stages. Individual ones of the comparators include the preamp stage 23B constructed using another differential input transistor pair for converting the associated reference signal voltage to a threshold (reference) current, and also include second common gate configured transistors 29 operating to suppress the feedback of noise from the N−1 latches to the reference signal generator 23. The reference current is coupled through the second common gate configured transistors 29 and is summed at an output node of the comparator with the divided portion of the input/dither current signal coupled through the cascode current buffer of the signal input stage 31.

The disclosed quantizer 14 can be extended to support a sigma-delta modulator structure with a chain of integrators 12A with weighted forward summation, wherein the outputs of all the integrators 12A are first summed in a summation block, the output of which is then fed to the quantizer 14. The integrator output summing operation can be implemented in the current mode by providing one linearized preamplifier per integrator, and by wiring the outputs of the preamplifiers together. The current mode dither signal from block 22 can be connected to the same summing node. The output of each switched capacitor integrator 12A of the sigma-delta loop filter 12 is sampled to a simple sampling capacitor. For example, in a third order modulator there are three integrators 12A, so three different voltages are sampled. The sampling is preferably used to avoid the propagation of kickback noise from the quantizer 14 to the loop filter 12. Each of the sampled voltages is converted to a current sample, and the current samples are summed in the current mode by connecting the outputs at a summation junction at the input of the quantizer 14. The output current of the dither block 22 may be added at the same summation junction. The sampled sum current is then fed to the sources of the common gate input transistors 31 of the quantizer comparators. The common gate configuration exhibits a low input impedance, which makes the summing of the currents more accurate, and the common gate transistors isolate the input stage from the dynamic latches 14B1 of the output stage 14B, and thus reduce the propagation of the kickback noise to the loop filter 12.

The linearized differential pairs 23B tap the appropriate threshold voltages and convert these voltages to currents. The ratio of the conversion coefficients (transconductances) can be accurately controlled by proper use of matching techniques.

In accordance with an aspect of these teachings, the reference currents are fed to the sources of the common gate input transistors 29 of the N−1 comparators via the DEM switch matrix 20B2, under control of the DEM algorithm block 20A. The common gate transistors of block 29 isolate the resistive string 23B of the threshold generator 23 from the dynamic latches 14B1, and thus reduce the propagation of the kickback noise to the threshold generator 23. The currents from the input stages 31 that sense the outputs of the integrators 12A of the loop filter 12, as well as the currents from the input stages 29 sensing the reference current thresholds, are summed at node 27 and fed, via the DEM switch matrix 20B1, to one of the latched regenerative loads 14B1. The timing diagram for the latched regenerative load 14B1 is also depicted in FIG. 10 (signals comp_clk and its delayed inverse).

It can be appreciated that the illustrated embodiments relax the timing constraints on the DEM algorithm block 20A as it is no longer in series with the feedback signal path that leads back to the DAC 18. Instead, the DEM algorithm block 20A is coupled in parallel with at least a portion of the feedback path to the loop filter DAC 18. Furthermore, by integrating the functions of the DEM unit 20 with the multilevel quantizer 14 other advantages are realized, such as a potential to reduce the required circuit area, the power consumption, and the cost. The integration of the DEM functions with the quantizer 14 is facilitated by implementing the DEM switching matrix 20B or matrices 20B1, 20B2 as current steering transistors, thereby resulting in the realization of the several advantages discussed previously.

It should be appreciated when considering the embodiment depicted in FIGS. 8, 9 and 10 that either of the DEM switch matrices 20B1 or 20B2 could be eliminated, and the DEM reordering function performed with only one switch matrix. That is, these teachings are not to be limited to the use of two DEM switching matrices within the quantizer 14, as one SM could be employed.

Furthermore, the DEM switch matrices could be positioned at other locations, such as between the outputs of the regenerative latches 14B1 and the inputs of the static latches 14B2, and to then employ voltage mode logic.

Thus, while these teachings have been particularly shown and described with respect to preferred embodiments thereof, it will be understood by those skilled in the art that changes in form and details may be made therein without departing from the scope and spirit of these teachings.

What is claimed is:

1. A sigma-delta modulator, comprising:
a loop filter having an input node for receiving an analog signal and an output node;
a multilevel quantizer having an input node coupled to said output node of said loop filter for receiving an input signal therefrom and a plurality of digital output nodes outputting a multibit digital signal that is indicative of a magnitude of said input signal; and
a feedback path from said plurality of digital output nodes of said quantizer to said loop filter, said feedback path comprising at least one dynamic element matching (DEM) switching matrix in series with said feedback path for reordering said multibit digital signal, and a DEM algorithm logic block having outputs coupled to said DEM switching matrix for controlling the operation thereof, said DEM algorithm logic block having an input coupled to said plurality of digital output nodes of said quantizer and being coupled in parallel with at least a portion of said feedback path.

2. A sigma-delta modulator as in claim 1, wherein said sigma-delta modulator operates in one of a normal sampling mode or a double sampling mode.

3. A sigma-delta moldulator, comprising:
a loop filter having an input node for receiving an analog signal and an output node;
a multilevel quantizer having an imput node coupled to said output node of said loop filter for receiving an input signal therefrom and a plurality of digital output nodes outputting a multibit digital signal that is indicative of a magnitude of said input signal; and
a feedback path from said plurality of digital output nodes of said quantizer to said loop filter, said feedback path comprising at least one dynamic element matching (DEM) switching matrix in series with said feedback path for reordering said multibit digital signal, and a DEM algorithm logic block logic block having outputs coupled to said DEM switching matrix for controlling the operation thereof, said DEM algorithm logic block having an input coupled to said plurality of digital output nodes of said quantizer and being coupled in parallel with at least a portion of said feedback path, and further comprising a dither signal generator having an output coupled to a second input node of said quantizer for introducing a dither signal into said input signal.

4. A sigma-delta modulator, comprising:
a loop filter having in input node for receiving an analog signal and an output node;
a multilevel quantizer having an input node coupled to said output node to said loop filter for receiving an input signal therefrom and a plurality of digital output nodes outputting a multibit digital signal that is indicative of a magnitude of said input signal; and
a feedback path from said plurality of digital output nodes of said quantizer to said loop filter, said feedback path comprising at least one dynamic element matching (DEM) switching matrix in series with said feedback path for recording said multibit digital signal, and a DEM algorithm logic block having outputs coupled to said DEM switching matrix for controlling the operation thereof, said DEM algorithm logic block having an input coupled to said plurality of digital output nodes of said quantizer and being coupled in parallel with at least a portion of said feedback path, wherein said at least one DEM switching matrix is a current mode DEM switching matrix that is located between said input node and said plurality of output nodes of said quantizer.

5. An N-level quantizer circuit, said quantizer circuit having an analog input terminal and N–1 digital output terminals, comprising:
a sampling circuit coupled to said input terminal for providing a sampled input voltage signal;
at least one preamplifier/converter stage for converting said sampled input voltage signal to a sampled input current signal;
N–1 comparator stages each having an input coupled to an output of said at least one preamplifier/converter stage, individual ones of said N–1 comparator stages operating to equally share said sampled input current signal and to compare said current signal to an associated one of N–1 reference current signals;
N–1 latches individual ones of which latch an output state of one of said N–1 comparators and having an output coupled to one of said N–1 digital output terminals of said quantizer circuit;
at least one current mode dynamic element matching (DEM) switching matrix operating to reorder a multibit digital signal appearing at said N–1 digital output terminals of said quantizer circuit; and
a DEM algorithm logic block having outputs coupled to said at least one current mode DEM switching matrix for controlling the operation thereof.

6. An N-level quantizer circuit as in claim 5, wherein said at least one current mode DEM switching matrix is coupled between outputs of said N–1 comparators and inputs of said N–1 latches.

7. An N-level quantizer circuit as in claim 5, further comprising a threshold signal generator outputting said N–1 reference current signals, and wherein said at least one current mode DEM switching matrix is coupled between outputs of said threshold signal generator and said N–1 comparators for reordering said N–1 threshold signals.

8. An N-level quantizer circuit as in claim 5, wherein individual ones of said N–1 comparators are constructed using a plurality of common gate configured transistors for suppressing a feedback of noise from said N−1 latches to others of said comparators and to said input terminal of said quantizer circuit.

9. An N-level quantizer circuit as in claim 5, and further comprising a dither signal generator having an output coupled to said output of said at least one preamplifier/converter stage.

10. An N-level quantizer circuit as in claim 5, wherein said at least one converter stage is comprised of a first differential transistor pair that converts said sampled input signal to said sampled input current signal, wherein individual ones of said N−1 comparators comprise an input stage comprised of first common gate configured transistors operating to suppress the feedback of noise from said N−1 latches to said input terminal of said quantizer circuit, and further comprise a threshold input stage comprised of a second differential input transistor pair for converting an associated reference signal voltage to a reference current, and further comprising second common gate configured transistors operating to suppress the feedback of noise from said N−1 latches to said reference signal generator, wherein said reference current is coupled through said second common gate configured transistors and is summed at an output node of said comparator with said sampled input current signal.

11. An N-level quantizer circuit as in claim 10, wherein said at least one current mode DEM switching matrix is coupled between said output node of each of said N−1 comparators and inputs of said N−1 latches.

12. An N-level quantizer circuit as in claim 5, wherein said quantizer circuit forms a part of a multi-bit sigma-delta modulator, and wherein said input terminal of said quantizer is coupled to an output of at least one integrator that forms a part of a loop filter.

13. An N-level quantizer circuit as in claim 5, and further comprising a pseudorandom dither current signal generator having a dither current output signal coupled to said output of said at least one preamplifier/converter stage where said dither current output signal is summed with said sampled current signal prior to being shared and compared with said associated one of said N−1 reference current signals.

14. A method for operating a quantizer of a sigma-delta modulator, comprising steps of:

sampling and converting an integrated input signal to a sampled current signal;

adding a dither current signal to the sampled current signal to generate a dithered sampled current signal;

coupling the dithered sampled current signal to an input terminal of individual ones of N−1 comparator stages;

dividing the dithered sampled current signal equally amongst the N−1 comparator stages;

operating individual ones of the N−1 comparator stages to compare a divided portion of the dithered sampled current signal to an associated one of N−1 reference current signals; and latching an output of each of the N−1 comparator stages with one of N−1 latches; wherein operating individual ones of the N−1 comparator stages includes operating at least one current mode dynamic element matching (DEM) switching matrix to reorder a multibit digital signal appearing at N−1 digital output terminals of a quantizer circuit, under control of a DEM algorithm logic block.

15. A method as in claim 14, wherein the step of operating at least one current mode DEM switching matrix includes reordering the N−1 reference current signals at inputs to the N−1 comparators.

16. A method as in claim 14, wherein the step of operating at least one current mode DEM switching matrix includes reordering N−1 comparator output signals prior to latching the N−1 comparator output signals.

17. A method as in claim 14, wherein the step of adding the dither current signal comprises a step of generating the dither current signal to have pseudorandom fluctuations in amplitude, and a magnitude that varies inversely to the magnitude of the input signal.

18. A sigma-delta modulator, comprising:

a loop filter having an input node for receiving an analog input signal and an output node;

a multilevel quantizer having an input node coupled to said output node of said loop filter for receiving an input signal therefrom and a plurality of digital output nodes outputting a multibit digital signal that is indicative of a magnitude of said input signal, said multilevel quantizer comprising at least one of a current mode or a voltage mode dynamic element matching (DEM) switching matrix coupled between said quantizer input node and said plurality of quantizer output nodes; and a feedback path from said plurality of digital nodes of said quantizer to said loop filter, said feedback path comprising a DEM algorithm logic block having outputs coupled to said DEM switching matrix for controlling the operation thereof.

* * * * *

UNITED STATES PATENT AND TRADEMARK OFFICE
CERTIFICATE OF CORRECTION

PATENT NO.    : 6,426,714 B1
DATED         : July 30, 2002
INVENTOR(S)   : Ruha et al.

It is certified that error appears in the above-identified patent and that said Letters Patent is hereby corrected as shown below:

Column 9,
Line 53, change "imput" to -- input --
Line 63, change "logic block logic block" to -- logic block --

Signed and Sealed this

Tenth Day of December, 2002

JAMES E. ROGAN
*Director of the United States Patent and Trademark Office*